United States Patent
Zeng

(10) Patent No.: US 10,893,187 B2
(45) Date of Patent: Jan. 12, 2021

(54) DUAL-CORE FOCUSING IMAGE SENSOR, CONTROL-FOCUSING METHOD THEREFOR, AND MOBILE TERMINAL

(71) Applicant: Guangdong OPPO Mobile Telecommunications Corp., Ltd., Guangdong (CN)

(72) Inventor: Yuanqing Zeng, Guangdong (CN)

(73) Assignee: GUANGDONG OPPO MOBILE TELECOMMUNICATIONS CORP., LTD., Dongguan (CN)

( * ) Notice: Subject to any disclaimer, the term of this patent is extended or adjusted under 35 U.S.C. 154(b) by 0 days.

(21) Appl. No.: 16/664,323

(22) Filed: Oct. 25, 2019

(65) Prior Publication Data

US 2020/0059592 A1 Feb. 20, 2020

Related U.S. Application Data

(63) Continuation of application No. PCT/CN2018/084023, filed on Apr. 23, 2018.

(30) Foreign Application Priority Data

Apr. 28, 2017 (CN) .......................... 2017 1 0296079

(51) Int. Cl.
*H04N 5/232* (2006.01)
*G02B 7/28* (2006.01)
(Continued)

(52) U.S. Cl.
CPC ......... *H04N 5/23212* (2013.01); *G02B 7/285* (2013.01); *G02B 7/36* (2013.01);
(Continued)

(58) Field of Classification Search
None
See application file for complete search history.

(56) References Cited

U.S. PATENT DOCUMENTS

| 2007/0154200 A1 | 7/2007 | Utagawa et al. |
| 2011/0109776 A1 | 5/2011 | Kawai |

(Continued)

FOREIGN PATENT DOCUMENTS

| CN | 1723564 A | 1/2006 |
| CN | 101385332 A | 3/2009 |

(Continued)

OTHER PUBLICATIONS

Extended Search Report for EP 18790152.5 dated Feb. 10, 2020.

(Continued)

*Primary Examiner* — James M Hannett

(57) ABSTRACT

A dual-core focusing image sensor is disclosed. The dual-core focusing image sensor includes a photosensitive cell array including a plurality of focus photosensitive units, each of which including a first half and a second half and a plurality of dual-core focusing photosensitive pixels; a filter cell array disposed above the photosensitive cell array and including a plurality of white filter cells; and a micro-lens array disposed above the filter cell array and including a plurality of first micro-lenses, each of which having an elliptical shape and a plurality of second micro-lenses. The first half is covered by one of the white filter cells and the second half is covered by a plurality of the second micro-lenses, each of the white filter cells is covered by one of the first micro-lenses. Each of the dual-core focusing photosensitive pixels is covered by one of the second micro-lenses.

20 Claims, 5 Drawing Sheets

(51) Int. Cl.
*G02B 7/36* (2006.01)
*G03B 13/36* (2006.01)
*H04N 5/225* (2006.01)
*H04N 5/247* (2006.01)

(52) U.S. Cl.
CPC .......... *G03B 13/36* (2013.01); *H04N 5/2258* (2013.01); *H04N 5/247* (2013.01)

(56) References Cited

U.S. PATENT DOCUMENTS

| | | |
|---|---|---|
| 2012/0300104 A1 | 11/2012 | Onuki et al. |
| 2015/0062390 A1 | 3/2015 | Kim et al. |
| 2016/0006924 A1* | 1/2016 | Takao ................. G06T 7/13 348/353 |
| 2016/0360182 A1* | 12/2016 | Seifi ................. H04N 13/232 |
| 2017/0094210 A1 | 3/2017 | Galor Gluskin |
| 2018/0063456 A1* | 3/2018 | Lee ................. H04N 5/3696 |
| 2018/0176452 A1* | 6/2018 | Nikkanen ........... H04N 5/3696 |
| 2018/0288306 A1* | 10/2018 | Lay ................. H04N 5/3696 |

FOREIGN PATENT DOCUMENTS

| | | |
|---|---|---|
| CN | 101888481 A | 11/2010 |
| CN | 104221369 A | 12/2014 |
| CN | 105378926 A | 3/2016 |
| CN | 105611124 A | 5/2016 |
| CN | 105979160 A | 9/2016 |
| CN | 106358026 A | 1/2017 |
| CN | 107146797 A | 9/2017 |
| JP | 2007103590 A | 4/2007 |
| JP | 2010212649 A | 9/2010 |
| JP | 2011103335 A | 5/2011 |
| JP | 2015050467 A | 3/2015 |
| WO | 2017052923 A1 | 3/2017 |

OTHER PUBLICATIONS

International search report, PCT/CN2018/084023, dated Jul. 5, 2018 (2 pages).
OA with English translation for a counterpart Chinese patent Application 201710296079.0, dated Apr. 23, 2019 (11 pages).

* cited by examiner

DUAL-CORE FOCUSING IMAGE SENSOR, CONTROL-FOCUSING METHOD THEREFOR, AND MOBILE TERMINAL

CROSS-REFERENCE TO RELATED APPLICATION(S)

This application is a continuation application of International (PCT) Patent Application No. PCT/CN2018/084023, filed on Apr. 23, 2018, which claims priority to Chinese Patent Application No. 201710296079.0, filed on Apr. 28, 2017, the contents of both which are herein incorporated by reference in their entireties.

TECHNICAL FIELD

The present disclosure generally relates to the technology field of image devices, and in particular, to a dual-core focusing image sensor, a control-focusing method therefor, and a mobile terminal.

BACKGROUND

Dual-core full-pixel focusing technology has become the most advanced focusing technology on the market in related focusing technologies. Compared to contrast focusing technologies, laser focusing technology, and phase focusing technology, dual-core full-pixel focusing technology has a faster focusing speed and a wider focusing range. In addition, since the "dual-core" photodiodes are "combined" into one pixel for output during imaging in the dual-core full-pixel focusing technology, the focusing performance can be ensured without affecting image quality.

SUMMARY

According to one aspect of the present disclosure, a control-focusing method for a dual-core focusing image sensor is provided. The dual-core focusing image sensor includes a photosensitive cell array including a plurality of focus photosensitive units, each of which includes a first half and a second half, and a plurality of dual-core focusing photosensitive pixels; a filter cell array disposed above the photosensitive cell array and including a plurality of white filter cells; and a micro-lens array disposed above the filter cell array and including a plurality of first micro-lenses, each of which has an elliptical shape and a plurality of second micro-lenses. The first half of each of the plurality of focus photosensitive units is covered by one of the white filter cells and the second half of each of the plurality of focus photosensitive units is covered by the plurality of the second micro-lenses, each of the white filter cells is covered by one of the first micro-lenses, and each of the dual-core focusing photosensitive pixels is covered by one of the second micro-lenses. The method includes controlling the photosensitive cell array to enter a focusing mode; reading first phase difference information of each of the focusing photosensitive units and second phase difference information of each of the dual-core focusing photosensitive pixels; and performing a focusing processing according to the first phase difference information and the second phase difference information.

According to another aspect of the present disclosure, a dual-core focusing image sensor is provided, which includes a photosensitive cell array including a plurality of focus photosensitive units, each of which includes a first half and a second half, and a plurality of dual-core focusing photosensitive pixels; a filter cell array disposed above the photosensitive cell array and including a plurality of white filter cells; and a micro-lens array disposed above the filter cell array and including a plurality of first micro-lenses, each of which has an elliptical shape and a plurality of second micro-lenses. The first half of each of the plurality of focus photosensitive units is covered by one of the white filter cells and the second half of each of the plurality of focus photosensitive units is covered by a plurality of the second micro-lenses, each of the white filter cells is covered by one of the first micro-lenses, and each of the dual-core focusing photosensitive pixels is covered by one of the second micro-lenses. First phase difference information of each of the focusing photosensitive units and second phase difference information of each of the dual-core focusing photosensitive pixels are configured for a focusing processing when the photosensitive cell array is in a focusing mode.

According to yet another aspect of the present disclosure, a mobile terminal is provided, which includes an image sensor, a non-transitory memory, and a processor. The image sensor includes a photosensitive cell array including a plurality of normal focusing photosensitive pixels and a plurality of dual-core focusing photosensitive pixels; a filter cell array disposed above the photosensitive cell array and including a plurality of white filter cells; and a micro-lens array disposed above the filter cell array. The micro-lens includes a plurality of first micro-lenses, each of which has an elliptical shape and covers one of the white filter cells, and a plurality of second micro-lenses, each of which covers one dual-core focusing photosensitive pixel. The normal focusing photosensitive pixels are covered by the white filter cells, each normal focusing photosensitive pixel corresponds to one dual-core focusing photosensitive pixel, and the normal photosensitive pixels covered by one of the white filter cells are arranged continuously. The non-transitory memory stores executable program codes. The processor is configured to perform a program corresponding to the executable program codes to: control the photosensitive cell array to enter a focusing mode; read first phase difference information of the normal photosensitive pixels covered by the one of the white filter cells and second phase difference information of each of the dual-core focusing photosensitive pixels; and perform a focusing processing according to the first phase difference information and the second phase difference information.

Additional aspects and advantages of the present disclosure will be set forth in part in the following description. The part may become apparent from the description in the following, or be learnt about from the practice of the present disclosure.

BRIEF DESCRIPTION OF DRAWINGS

The above and/or additional aspects and advantages of the present disclosure will become apparent and readily understood from the following description in accordance with drawings.

DETAILED DESCRIPTION

Figure 1:
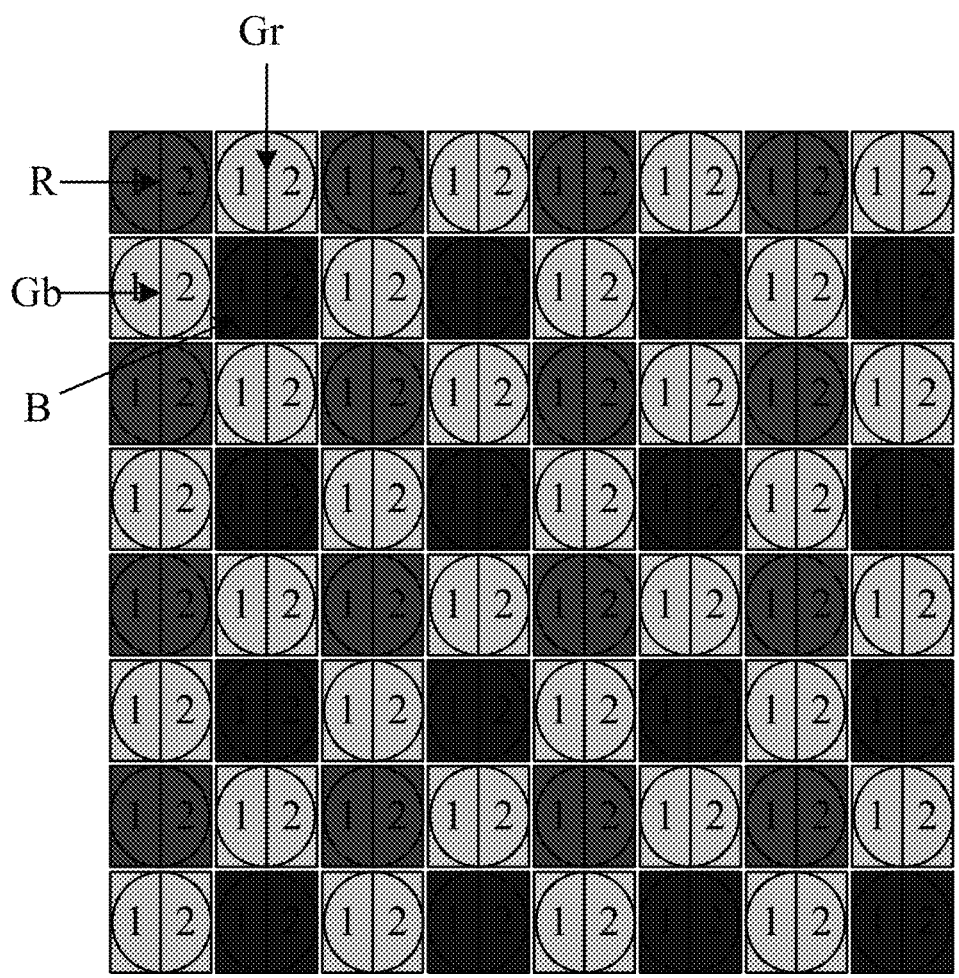
FIG. 1 is a schematic structural view of a conventional dual-core focusing image sensor.

The embodiments of the present disclosure will be described in detail below. Examples of the embodiments may be illustrated in the drawings. Same or similar reference numerals may be used to indicate same or similar elements or elements having same or similar functions. The embodiments described below with reference to the drawings are illustrative, and are not intended to be construed as limiting.

A dual-core focusing image sensor, a control-focusing method thereof, and an imaging device according to embodiments of the present disclosure will be described below with reference to the accompanying drawings.

Dual-core full-pixel focusing technology is the most advanced focusing technology on the market. A structure of a dual-core focusing sensor used in this focusing technology is shown in FIG. 1. There are correspondingly two photodiodes under a respective micro-lens (circle in FIG. 1 represents the micro-lens). When an imaging processing is performed, values of "1" and "2" are added to obtain a single pixel value. When a focusing processing is performed, all values of "1" and "2" are read out, respectively, and then the driving amount and driving direction of the lens can be derived by calculating phase difference between the values of "1" and "2".

It can be understood that as the total number of pixels increases, the photosensitive area corresponding to "1" and "2" becomes smaller, and then light throughput is reduced, so that the phase information is easily flooded by noise in a low light environment, and it is difficult to focus.

As it can be seen from the above analysis, when the dual-core full-pixel focusing technology is used for focusing, a photodiode of each pixel is divided into two photodiodes, so that the light throughput is reduced, and then it is difficult to dual-core focus in a low light environment.

In order to solve the problem that it is difficult to dual-core focus in the low light environment in the existing dual-core full-pixel focusing technology, a control-focusing method for a dual-core focusing image sensor is provided in the present disclosure, which can increase the light throughput of focusing pixels, effectively improve focusing speed in the low light environment, and ensure the accuracy of image color reproduction.

A control-focusing method for a dual-core focusing image sensor is provided. The dual-core focusing image sensor includes a photosensitive cell array including a plurality of focus photosensitive units, each of which including a first half and a second half and a plurality of dual-core focusing photosensitive pixels; a filter cell array disposed above the photosensitive cell array and including a plurality of white filter cells; and a micro-lens array disposed above the filter cell array and including a plurality of first micro-lenses, each of which having an elliptical shape and a plurality of second micro-lenses. The first half of each of the plurality of focus photosensitive units is covered by one of the white filter cells and the second half of each of the plurality of focus photosensitive units is covered by the plurality of the second micro-lenses, each of the white filter cells is covered by one of the first micro-lenses, and each of the dual-core focusing photosensitive pixels is covered by one of the second micro-lenses. The method includes controlling the photosensitive cell array to enter a focusing mode; reading first phase difference information of each of the focusing photosensitive units and second phase difference information of each of the dual-core focusing photosensitive pixels; and performing a focusing processing according to the first phase difference information and the second phase difference information.

In one embodiment, the first half of each of the plurality of focus photosensitive units has a plurality of photosensitive pixels; and the reading the first phase difference information of each of the focusing photosensitive units includes: reading output values of a part of the photosensitive pixels in the first half of each of the plurality of focus photosensitive units as a set of first output values; reading output values of remaining of the photosensitive pixels in the first half of each of the plurality of focus photosensitive units as a set of second output values; and acquiring the first phase difference information according to the set of first output values and the set of second output values.

In one embodiment, each of the dual-core focusing photosensitive pixels has a first photodiode and a second photodiode; and the reading the second phase difference information of each of the dual-core focusing photosensitive pixels includes: reading an output value of the first photodiode as a third output value; reading an output value of the second photodiode as a fourth output value; and acquiring the second phase difference information according to the third output value and the fourth output value.

In one embodiment, the dual-core focusing photosensitive pixels are arranged in a Bayer pattern.

In one embodiment, the micro-lens array has a vertical centerline and a horizontal centerline, and the first micro-lenses include: a first group of first micro-lenses disposed along the horizontal centerline; and a second group of first micro-lenses disposed along the vertical centerline.

In one embodiment, the micro-lens array has four edges, and the first micro-lenses further include a third group of first micro-lenses disposed along the four edges.

In one embodiment, each of the first group of first micro-lenses and the second group of first micro-lenses has a lens density greater than a lens density of the third group of first micro-lenses, respectively.

In one embodiment, each of the focusing photosensitive units includes N*N photosensitive pixels and the photosensitive pixels in the first half are dual-core focusing photosensitive pixels, and the first half is an upper half, a lower half, a left half, or a right half of the each of the focusing photosensitive units; each of the dual-core focusing photosensitive pixels has a first photodiode and a second photodiode. The method further includes: controlling the photosensitive cell array to enter an imaging mode; and controlling the photosensitive cell array to be exposed, and reading a set of output values of the photosensitive cell array to obtain a set of pixel values of the photosensitive cell array to generate an image, wherein the pixel values of the first half are obtained by an interpolation algorithm, and the pixel value of each of the dual-core focusing photosensitive pixels is a sum of an output value of the first photodiode and an output value of the second photodiode.

A dual-core focusing image sensor is provided, which includes a photosensitive cell array including a plurality of focus photosensitive units, each of which including a first half and a second half, and a plurality of dual-core focusing photosensitive pixels; a filter cell array disposed above the photosensitive cell array and including a plurality of white filter cells; and a micro-lens array disposed above the filter cell array and including a plurality of first micro-lenses, each of which having an elliptical shape and a plurality of second micro-lenses. The first half of each of the plurality of focus photosensitive units is covered by one of the white filter cells and the second half of each of the plurality of focus photosensitive units is covered by the plurality of the second micro-lenses, each of the white filter cells is covered by one of the first micro-lenses, and each of the dual-core focusing photosensitive pixels is covered by one of the second micro-lenses. First phase difference information of each of the focusing photosensitive units and second phase difference information of each of the dual-core focusing photosensitive pixels are configured for a focusing processing when the photosensitive cell array is in a focusing mode.

In one embodiment, the dual-core focusing photosensitive pixels are arranged in a Bayer pattern.

In one embodiment, the micro-lens array has a vertical centerline and a horizontal centerline, and the first micro-lenses include: a first group of first micro-lenses disposed along the horizontal centerline; and a second group of first micro-lenses disposed along the vertical centerline.

In one embodiment, the micro-lens array has four edges, the first micro-lenses further include a third group of first micro-lenses disposed along the four edges.

In one embodiment, each of the first group of first micro-lenses and the second group of first micro-lenses has a lens density greater than a lens density of the third group of first micro-lenses, respectively.

In one embodiment, each of the focusing photosensitive unit includes N*N photosensitive pixels and the photosensitive pixels in the first half are dual-core focusing photosensitive pixels, and the first half is an upper half, a lower half, a left half, or a right half of the each of the focusing photosensitive units.

A mobile terminal is provided, which includes an image sensor, a non-transitory memory, and a processor. The image sensor includes a photosensitive cell array including a plurality of normal focusing photosensitive pixels and a plurality of dual-core focusing photosensitive pixels; a filter cell array disposed above the photosensitive cell array and including a plurality of white filter cells; and a micro-lens array disposed above the filter cell array. The micro-lens includes a plurality of first micro-lenses, each of which has an elliptical shape and covers one of the white filter cells, and a plurality of second micro-lenses, each of which covers one dual-core focusing photosensitive pixel. The normal focusing photosensitive pixels are covered by the white filter cells, each normal focusing photosensitive pixel corresponds to one dual-core focusing photosensitive pixel, and the normal photosensitive pixels covered by one of the white filter cells are arranged continuously. The non-transitory memory stores executable program codes. The processor is configured to perform a program corresponding to the executable program codes to: control the photosensitive cell array to enter a focusing mode; read first phase difference information of the normal photosensitive pixels covered by the one of the white filter cells and second phase difference information of each of the dual-core focusing photosensitive pixels; and perform a focusing processing according to the first phase difference information and the second phase difference information.

In one embodiment, the dual-core focusing photosensitive pixels are arranged in a Bayer pattern.

In one embodiment, the micro-lens array has a vertical centerline and a horizontal centerline, and the first micro-lenses include: a first group of first micro-lenses disposed along the horizontal centerline; and a second group of first micro-lenses disposed along the vertical centerline.

In one embodiment, the micro-lens array has four edges, the first micro-lenses further include a third group of first micro-lenses disposed along the four edges.

In one embodiment, each of the first group of first micro-lenses and the second group of first micro-lenses has a lens density greater than a lens density of the third group of first micro-lenses, respectively.

In one embodiment, a number of the normal focusing photosensitive pixels covered by one of the white filter cells is 2.

The dual-core focusing image sensor required for implementing the control-focusing method for the dual-core focusing image sensor provided in the present disclosure will be described firstly in the following.

Figure 2:
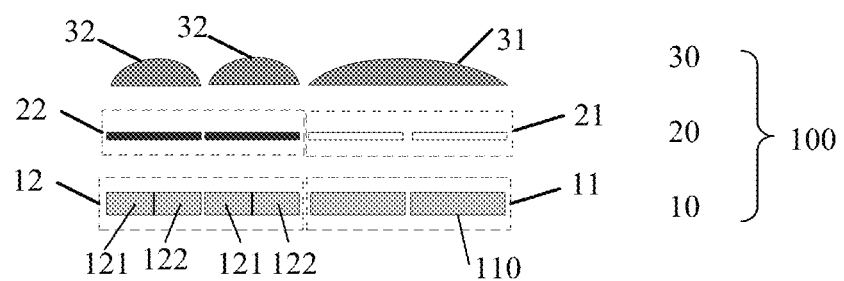
FIG. 2 is a cross-sectional view of a dual-core focusing image sensor according to an embodiment of the present disclosure.
Figure 3:
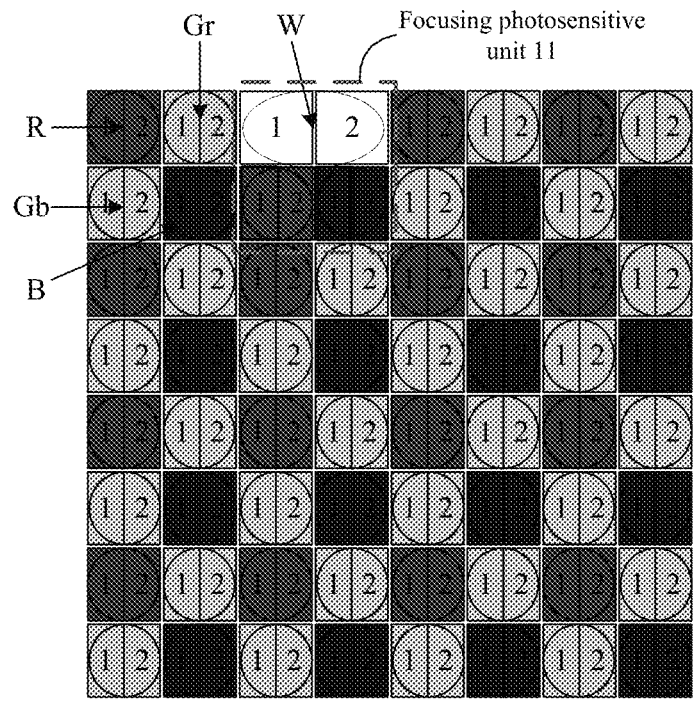
FIG. 3 is a plan view of a dual-core focusing image sensor according to an embodiment of the present disclosure.

FIG. 2 is a cross-sectional view of a dual-core focusing image sensor according to an embodiment of the present disclosure, and FIG. 3 is a plan view of a dual-core focusing image sensor according to an embodiment of the present disclosure.

As shown in FIGS. 2 and 3, the dual-core focusing image sensor 100 includes a photosensitive cell array 10, a filter cell array 20, and a micro-lens array 30.

The filter cell array 20 is disposed above the photosensitive cell array 10, and the micro-lens array 30 is disposed above the filter cell array 20. The micro-lens array 30 includes first micro-lenses 31 and second micro-lenses 32, and each of the first micro-lenses 31 has an elliptical shape. One first micro-lens 31 covers one white filter cell 21. One white filter cell 21 covers half of one focusing photosensitive unit 11, which means that an area of one white filter cell 21 is half of that of the focusing photosensitive unit 11. The other half of the focusing photosensitive unit 11 is covered by a plurality of second micro-lenses 32. That is, half of the focusing photosensitive unit 11 is covered by one white filter cell 21 and the other half is covered by a plurality of second micro-lenses 32. One second micro-lens 32 covers one filter cell 22, and one filter cell 22 covers one dual-core focusing photosensitive pixel 12.

In an embodiment of the present disclosure, the dual-core focusing photosensitive pixels 12 are arranged in a Bayer pattern. Image signals may be processed by a traditional algorithm for the Bayer structure in a case where the Bayer structure is used, and thus, no major adjustments in hardware structure are required. A dual-core focusing photosensitive pixel 12 has two photodiodes, which are a first photodiode 121 corresponding to "1" of the dual-core focusing photosensitive pixel 12 in FIG. 3 and a second photodiode 122 corresponding to "2" of the dual-core focusing photosensitive pixel 12 in FIG. 3.

In an embodiment of the present disclosure, the focusing photosensitive unit 11 includes N*N photosensitive pixels 110, and a white filter cell 21 covers the upper half, lower half, the left half or right half of the focusing photosensitive unit 11. The location of the white filter cell 21 in the focusing photosensitive unit 11 is not limited in the present disclosure. In the dual-core focusing image sensor as shown in FIG. 3, the focusing photosensitive unit 11 includes 2*2 photosensitive pixels 110. The white filter cell 21, which is W as shown in FIG. 3, covers the upper half of the focusing photosensitive unit 11. The lower half of the focusing photosensitive unit 11 is covered by two second micro-lenses 32, one of which covers one red filter cell and the other covers one blue filter cell.

In summary, in the dual-core focusing image sensor 100 of an embodiment of the present disclosure, N*N photosensitive pixels 110 is divided into two halves, one of which is covered by one first micro-lens 31 and the other is covered by a plurality of second micro-lenses 32. A section covered by the first micro-lens 31 corresponds to one white filter cell 21, and a section covered by any one of the second micro-lenses 32 corresponds to one dual-core focusing photosensitive pixel.

In one embodiment of the present disclosure, the micro-lens array 30 has a horizontal centerline and a vertical centerline, and there are multiple first micro-lenses 31. The first micro-lenses 31 include a first group of first micro-lenses 31 disposed along the horizontal centerline and a second group of first micro-lenses 31 disposed along the vertical centerline.

In one embodiment of the present disclosure, the micro-lens array 30 may further has four edges. At this time, the first micro-lenses 31 further include a third group of first micro-lenses 31 disposed along the four edges.

In a case where the micro-lens array 30 has the horizontal centerline, the vertical centerline, and four edges, each of the first group of first micro-lenses 31 and the second group of first micro-lenses 31 has a lens density greater than a lens density of the third group of first micro-lenses 31, respectively.

Figure 4:
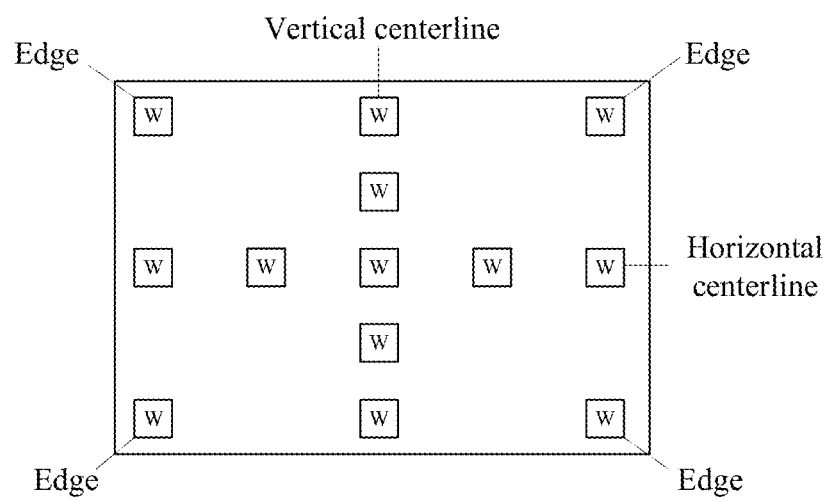
FIG. 4 is a distribution diagram illustrating first micro-lenses are arranged.

In order to understand, a manner in which the first micro-lenses 31 are arranged in the micro-lens array 30 is described below with reference to the drawings. FIG. 4 is a distribution diagram illustrating first micro-lenses are arranged. As shown in FIG. 4, the white filter cells 21 (i.e. Ws in FIG. 4) covered by the first micro-lens 31 are scattered in the whole dual-core focusing image sensor, which account for 3% to 5% of the total number of pixels. Ws are distributed densely along the horizontal centerline and the vertical centerline of the micro-lens array 30, and Ws are distributed sparsely along the four edges. This can effectively increase focusing speed without affecting image quality when focusing accuracy and speed in the middle of the screen area may be took into account firstly.

It should be noted that Ws in FIGS. 3 and 4 indicate white filter cells 21 covered by the first micro-lenses 31 in the dual-core focusing image sensor, and a larger light throughput can be obtained when the white filter cell 21 is used. Filter cells covered by the first micro-lenses 31 may also be green filter cells, that is, Ws in FIGS. 3 and 4 may be replaced with Gs, and more information is available at the time of image processing when the green filter cell is used. It should be understood that, only the white filter cell is taken as an example in embodiments of the present disclosure, which does not limit the present disclosure.

Figure 5:
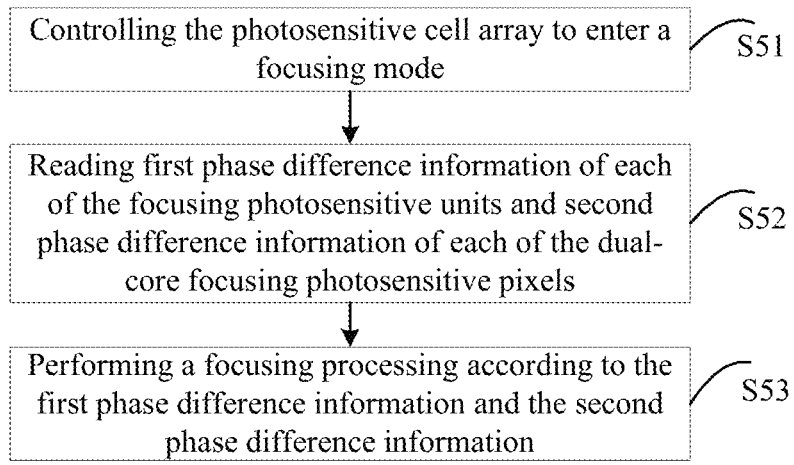
FIG. 5 is a flowchart of a control-focusing method for a dual-core focusing image sensor according to an embodiment of the present disclosure.

A control-focusing method for a dual-core focusing image sensor according to embodiments of the present disclosure will be described below based on the dual-core focusing image sensor in FIGS. 2-4. FIG. 5 is a flowchart of a control-focusing method for a dual-core focusing image sensor according to an embodiment of the present disclosure. As shown in FIG. 5, the method includes actions/operations in the following blocks.

At block S51, the method controls the photosensitive cell array to enter a focusing mode.

When a camera is used to take pictures, the photosensitive cell array may be controlled to enter the focusing mode if the displayed picture is not clear enough, such that the sharpness of the picture is improved by focusing.

At block S52, the method reads first phase difference information of each of the focusing photosensitive units and second phase difference information of each of the dual-core focusing photosensitive pixels.

In an embodiment of the present disclosure, after entering the focusing mode, the first phase difference information of the focusing photosensitive unit and the second phase difference information of the dual-core focusing photosensitive pixel may be further read.

Alternatively, in one embodiment of the present disclosure, reading the first phase difference information of a focusing photosensitive unit may include: reading output values of a part of the photosensitive pixels in the focusing photosensitive unit as a set of first output values; reading output values of another part of the photosensitive pixels in the focusing photosensitive unit as a set of second output values; and acquiring the first phase difference information according to the set of first output values and the set of second output values.

It should be noted that, in the embodiments of the present disclosure, the first phase difference information of a focusing photosensitive unit is read, which refers to the first phase difference information of a section of the focusing photosensitive unit covered by a white filter cell.

In order to understand, the following explanation will be made with reference to FIG. 3.

As shown in FIG. 3, the upper half of the focusing photosensitive unit is covered by the white filter cell (W in FIG. 3), the left part of the white filter cell may correspond to a part of the focusing photosensitive unit, and the right part of the white filter cell may correspond to another part of the focus photosensitive unit. An output value at "1" corresponding to the white filter cell is the output value of a photosensitive pixel in the focusing photosensitive unit and is used as the first output value. An output value at "2" corresponding to the white filter cell is the output value of another photosensitive pixel in the focusing photosensitive unit and is used as the second output value. Finally, the first phase difference information is obtained according to the first output value and the second output value. For example, the difference between the first output value and the second output value may be used as the first phase difference information.

It should be noted that the white filter cell may cover the upper half, the lower half, the left half or the right half of the focusing photosensitive unit. However, it should be appreciated that no matter which part of the focusing photosensitive unit is covered by the white filter cell, the process of acquiring the first phase difference information is the same, which is to obtain output values at "1" and "2" corresponding to the white filter cell to obtain the first phase difference information. A case where the white filter cell covers the upper half of the focusing photosensitive unit is only took as an example to be described in the present disclosure, and a case where the white filter cell covers other parts of the focusing photosensitive unit will not be described in detail.

Alternatively, in one embodiment of the present disclosure, reading the second phase difference information of a dual-core focusing photosensitive pixel may include: reading an output value of the first photodiode as a third output value; and reading an output value of the second photodiode as a fourth output value; and obtaining the second phase difference information according to the third output value and the fourth output value.

Still taking FIG. 3 as an example, the second phase difference information of all the dual-core focusing photosensitive pixels is calculated in the same manner in FIG. 3. It is described by taking an example of calculating the second phase difference information corresponding to Gr in FIG. 3 herein. Firstly, the output value at "1" corresponding to Gr is read as the third output value, and the output value at "2" corresponding Gr is read as the fourth output value, and the second phase difference information is obtained according to the third output value and the fourth output value. For example, the difference between the third output value and the fourth output value may be calculated as the second phase difference information. Thus, the second phase difference information of a dual-core focusing photosensitive pixel may be obtained by calculating the difference between values at "1" and "2" in the dual-core focusing photosensitive pixel.

At block S53, the method performs a focusing processing according to the first phase difference information and the second phase difference information.

In embodiments of the present disclosure, after the first phase difference information of the focusing photosensitive units and the second phase difference information of the dual-core focusing photosensitive pixels are read, the focusing processing may be performed according to the first phase difference information and the second phase difference information.

In the related dual-core focusing technology, the phase difference is usually calculated according to the output values of two photodiodes in the dual-core focusing photosensitive pixel, and then the driving amount and driving direction of the lens are calculated. Thus, the focusing processing is achieved. The focusing speed is slow in the low light environment.

However, in embodiments of the present disclosure, one first micro-lens with an ellipse shape covers one white filter cell and one white filter cell covers one focusing photosensitive unit. As the white filter cell is adopted, the first phase difference information with a larger light throughput for the focusing processing may still be obtained in the low light environment. Thus, the focusing speed is improved in the low light environment.

In the control-focusing method for the dual-core focusing image sensor according to embodiments of the present disclosure, one first micro-lens with an ellipse shape covers one white filter cell, half of a focusing photosensitive unit is covered by the white filter cell and the other half is covered by multiple second micro-lenses, and one second micro-lens covers a dual-core focusing photosensitive pixel. As the first phase difference information of the focusing photosensitive unit and the second phase difference information of the dual-core focusing photosensitive pixel are read and a focusing processing is performed according to the first phase difference information and the second phase difference information, light throughput of focusing pixels can be increased, and the focusing speed can be effectively improved in the low light environment. As half of the focusing photosensitive unit are dual-core focusing photosensitive pixels, the accuracy of image color reproduction can be ensured.

Figure 6:
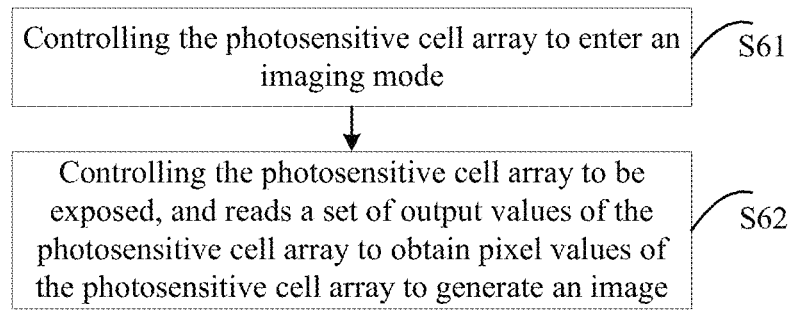
FIG. 6 is a flowchart of a control-focusing method of a dual-core focusing image sensor according to another embodiment of the present disclosure.

It should be understood that the purpose of focusing is to obtain a picture with higher definition. In practical applications, after the focusing processing is completed, usually, an imaging process is further included. Therefore, as shown in FIG. 6, which is based on FIG. 5, after block S53, the method further includes actions/operations in the following.

At block S61, the method controls the photosensitive cell array to enter an imaging mode.

In an embodiment of the present disclosure, after the focusing processing is completed, the photosensitive cell array is further controlled to enter the imaging mode.

At block S62, the method controls the photosensitive cell array to be exposed, and reads a set of output values of the photosensitive cell array to obtain pixel values of the photosensitive cell array to generate an image.

The pixel values of a part of the focusing photosensitive unit covered by the white filter cell is obtained by an interpolation reconstruction algorithm.

In an embodiment of the present disclosure, after the photosensitive cell array enters the imaging mode, the photosensitive cell array is controlled to be exposed, and the set of output values of the photosensitive cell array is read. Then, pixel values of the photosensitive cell array are obtained to generate the image.

In an embodiment of the present disclosure, reading the set of output values of the photosensitive cell array to obtain the pixel values of the photosensitive cell array may include: reading output values of two photodiodes in the dual-core focusing photosensitive pixel, and then adding the output values of the two photodiodes to obtain a pixel value of the dual-core focusing photosensitive pixel. For the portion of the focusing photosensitive unit covered by the white filter cell, the interpolation reconstruction algorithm is used to obtain the pixel values of this portion. The interpolation reconstruction algorithm may be any one of a nearest neighbor interpolation algorithm, a bilinear interpolation algorithm, and a cubic convolution interpolation algorithm.

For simplicity, the nearest neighbor interpolation algorithm may be adopted to obtain the pixel values of the focusing photosensitive unit. That is, a gray value of an input pixel, which is closest to a position to which the focusing photosensitive unit is mapped, is selected as a result of the interpolation, which is the pixel value of the focusing photosensitive unit.

Figure 7:
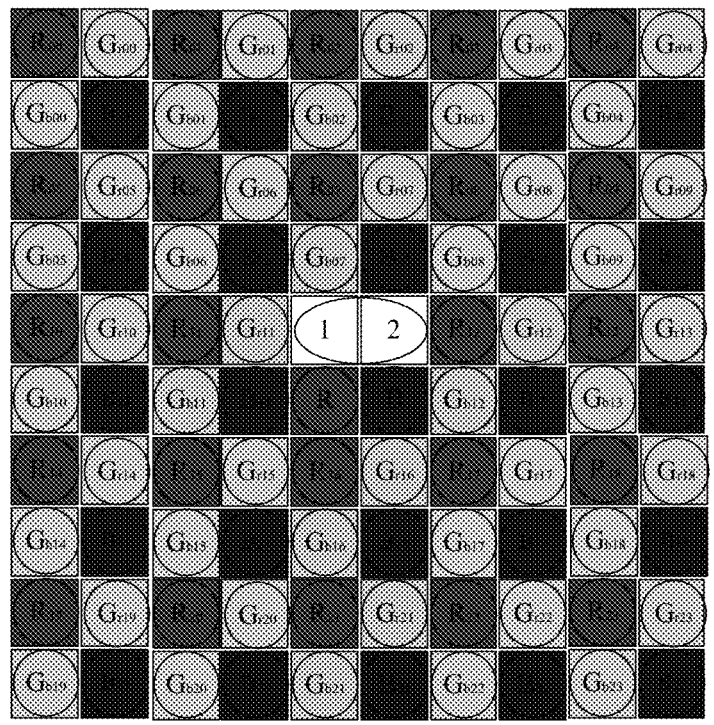
FIG. 7 is a schematic view for obtaining pixel values of a focusing photosensitive unit using an interpolation algorithm.

FIG. 7 is a schematic view for obtaining pixel values of a focusing photosensitive unit using an interpolation algorithm. As shown in FIG. 7, in the focusing photosensitive unit with a size of 2*2, the upper half of the photosensitive unit corresponds to a white filter cell. In order to output an image with good quality, output values of the photosensitive pixels of "1" and "2" corresponding to the white filter cell are required to be interpolated to be reconstructed. That is, an RGB value of each photosensitive pixel corresponding to the white filter cell needs to be calculated. Since the lower half of the focusing photosensitive unit retains pixel information of red (R) and blue (B), the RGB values corresponding to the white filter cell may be obtained according to pixel values of 8 pixels adjacent to the white filter cell when the interpolation reconstruction is performed for the photosensitive pixels corresponding to the white filter cell. Taking calculating the RGB values at "1" corresponding to the white filter cell as an example, the R pixel value at "1" is marked as $R_1$, the G pixel value at "1" is marked as $G_1$, and the B pixel value at "1" is marked as $B_1$ for description, which are calculated as follows.

$$R_1 = \frac{R_{07} + R_{11} + 2R + R_{16} + R_{12}}{6};$$

$$G_1 = \frac{2G_{b07} + 2G_{r11}}{4};$$

$$B_1 = \frac{B_{06} + B_{07} + B_{11}}{3}.$$

It should be noted that the interpolation reconstruction manner for the RGB value at "2" corresponding to the white filter cell is the same as that for the RGB value at "1", in which the adjacent pixels are selected for interpolation reconstruction and which will not described in order to avoid redundancy.

It should be noted that the above description of the algorithm for acquiring the pixel values of the focusing photosensitive unit is only for explaining the present disclosure, and is not intended to limit the present disclosure. During an actual processing, pixel values of several adjacent pixels are used for the interpolation reconstruction in order to a more accurate pixel value, but not limited to a pixel value of an adjacent pixel. A pixel value with a smaller distance is allocated to a higher weight, and a pixel value with a larger distance is allocated to a lower weight. That is, a weight of a pixel value in the interpolation reconstruction algorithm is inversely proportional to a distance for the reconstructed pixel.

In embodiments of the present disclosure, after the pixel value of the focusing photosensitive unit are reconstructed, an image may be generated according to the pixel values of the respective pixel points in the photosensitive cell array.

In the control-focusing method for the dual-core focusing image sensor of embodiments of the present disclosure, the photosensitive cell array is controlled to enter the imaging mode and to be exposed after the focusing processing is completed. The output values of the photosensitive cell array are read to obtain the pixel values of the photosensitive cell array to generate an image. As R pixel and B pixel, which are located at the same array with the white filter cell, are retained, the accuracy of image color reproduction can be ensured, and the image quality can be improved.

In order to implement the above embodiments, a dual-core focusing image sensor is also proposed in the present disclosure. FIG. 2 is a cross-sectional view of a dual-core focusing image sensor according to an embodiment of the present disclosure, and FIG. 3 is a plan view of a dual-core focusing image sensor according to an embodiment of the present disclosure.

It should be noted that the description of the dual-core focusing image sensor in the embodiments of the control-focusing method for the dual-core focusing image sensor is also applicable to the dual-core focusing image sensor according to embodiments of the present disclosure, and the implementation principle thereof is similar, and details are not described herein again.

In the dual-core focusing image sensor according to embodiments of the present disclosure, the micro-lens array is set to include first micro-lenses and the second micro-lenses, each of the first micro-lenses is set to have an elliptical shape, half of the focusing photosensitive unit is covered by the white filter cell and the other half is covered by a plurality of second micro-lenses, and one second micro-lens covers a dual-core focusing photosensitive pixel. This can increase light throughput of the focusing pixels, and provide a hardware basis for improving the focusing speed in the low light environment and ensuring the accuracy of image color reproduction.

Figure 8:
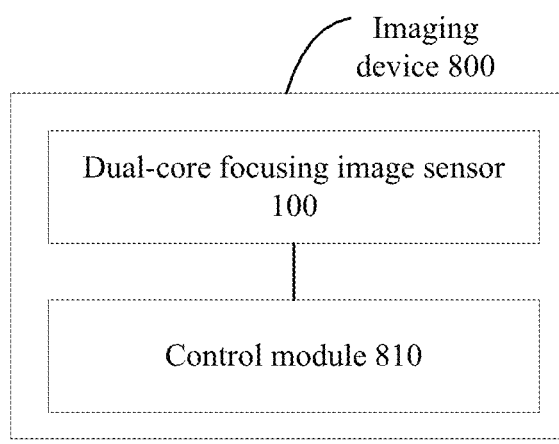
FIG. 8 is a schematic structural diagram of an imaging device according to an embodiment of the present disclosure.

In order to implement the above embodiments, an imaging device is also proposed in the present disclosure, and FIG. 8 is a schematic structural diagram of an imaging device according to an embodiment of the present disclosure.

As shown in FIG. 8, the imaging device 800 includes the dual-core focusing image sensor 100 according to the above embodiments and a control module 810.

The control module 810 controls the photosensitive cell array to enter the focusing mode, reads the first phase difference information of each of the focusing photosensitive units and the second phase difference information of each of the dual-core focusing photosensitive pixels, and performs a focusing processing according to the first phase difference information and the second phase difference information.

Alternatively, in one embodiment of the present disclosure, the control module is configured to read output values of a part of the photosensitive pixels in the focusing photosensitive unit as a set of first output values; read output values of another part of the photosensitive pixels in the focusing photosensitive unit as a set of second output values; and acquire the first phase difference information according to the set of first output values and the set of second output values.

It should be noted that, in the embodiments of the present disclosure, the first phase difference information of a focusing photosensitive unit is read, which refers to the first phase difference information of a section of the focusing photosensitive unit covered by a white filter cell.

In one embodiment of the present disclosure, a dual-core focusing photosensitive pixel in the dual-core focusing image sensor 100 has two photodiodes, which are a first photodiode and a second photodiode, respectively. Therefore, the control module 810 is further configured to read an output value of the first photodiode as a third output value, read an output value of the second photodiode as a fourth output value, and obtain the second phase difference information according to the third output value and the fourth output value.

It should be understood that the purpose of focusing is to obtain a picture with higher definition. In practical applications, after the focusing processing is completed, usually, an imaging process is further included. Therefore, in an embodiment of the present disclosure, the control module 810 is further configured to control the photosensitive cell array to enter an imaging mode, and then control the photosensitive cell array to be exposed, and read a set of output values of the photosensitive cell array to obtain pixel values of the photosensitive cell array to generate an image. The pixel values of a part of the focusing photosensitive unit covered by the white filter cell is obtained by an interpolation reconstruction algorithm.

In the imaging device according to embodiments of the present disclosure, one first micro-lens with an ellipse shape covers one white filter cell, half of a focusing photosensitive unit is covered by the white filter cell and the other half is covered by multiple second micro-lenses, and one second micro-lens covers a dual-core focusing photosensitive pixel. As the first phase difference information of the focusing photosensitive unit and the second phase difference information of the dual-core focusing photosensitive pixel are read and a focusing processing is performed according to the first phase difference information and the second phase difference information, light throughput of focusing pixels can be increased, and the focusing speed can be effectively improved in the low light environment. As half of the focusing photosensitive unit are dual-core focusing photosensitive pixels, the accuracy of image color reproduction can be ensured.

Figure 9:
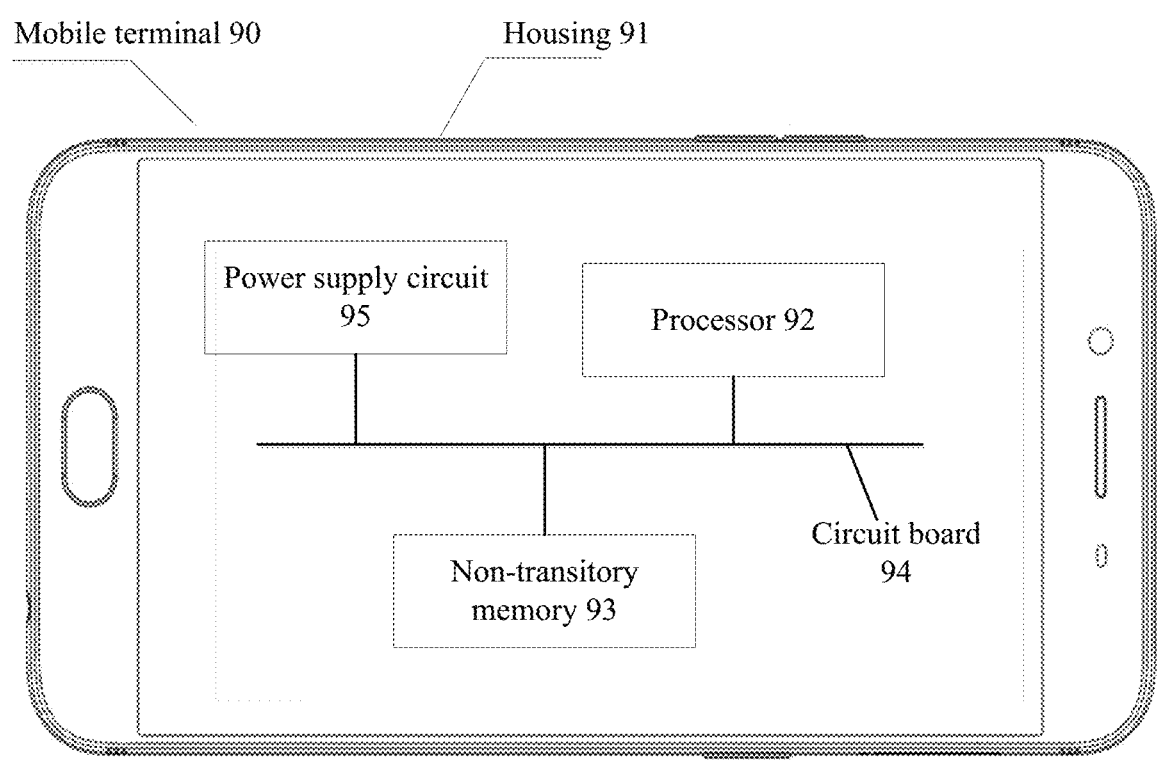
FIG. 9 is a schematic structural diagram of a mobile terminal according to an embodiment of the present disclosure.

In order to implement the foregoing embodiments, a mobile terminal is also provided the present disclosure, and FIG. 9 is a schematic structural diagram of a mobile terminal according to an embodiment of the present disclosure.

As shown in FIG. 9, the mobile terminal 90 may include a housing 91, a processor 92, a non-transitory memory 93, a circuit board 94, and a power supply circuit 95. In some embodiments, the circuit board 94 may be disposed inside a space enclosed by the housing 91. The processor 92 and the non-transitory memory 93 may be disposed on the circuit board 94. The power supply circuit 95 may be configured to supply power to various circuits or components of the mobile terminal. The non-transitory memory 93 may be configured to store executable program code. The processor 92 may be configured to read the executable program code stored in the non-transitory memory 93 and run a program corresponding to the executable program code, in order to perform the control-focusing method for the dual-core focusing image sensor in the above embodiments.

In the mobile terminal according to embodiments of the present disclosure, one first micro-lens with an ellipse shape covers one white filter cell, half of a focusing photosensitive unit is covered by the white filter cell and the other half is covered by multiple second micro-lenses, and one second micro-lens covers a dual-core focusing photosensitive pixel. As the first phase difference information of the focusing photosensitive unit and the second phase difference information of the dual-core focusing photosensitive pixel are read and a focusing processing is performed according to the first phase difference information and the second phase difference information, light throughput of focusing pixels can be increased, and the focusing speed can be effectively improved in the low light environment. As half of the focusing photosensitive unit are dual-core focusing photosensitive pixels, the accuracy of image color reproduction can be ensured.

It should be noted that, in the present disclosure, the use of relational terms, such as first and second, and the like are used solely to distinguish one entity or action from another entity or action without necessarily requiring or implying any actual such relationship or order between such entities or actions. Moreover, the terms "comprise", "include" or any other variations thereof are meant to cover non-exclusive including, so that the process, method, article or device comprising a series of elements do not only include those elements, but also includes other elements that are not explicitly listed or also include the inherent elements of the process, method, article or device. In the case that there are no more restrictions, an element qualified by the statement "comprise a . . . " does not exclude the presence of additional identical elements in the process, method, article or device that includes the element.

The logic and/or steps described in other manners herein or shown in the flow chart, for example, a particular order list of executable instructions for realizing the logical function, may be specifically achieved in any computer-readable medium to be used by an instruction execution system, a device or an equipment (such as a system based on computers, a system including processors or other systems capable of acquiring an instruction from the instruction execution system, device and equipment and executing the instruction), or to be used in combination with the instruction execution system, device and equipment. As to the specification, "the computer-readable medium" may be any device adaptive for including, storing, communicating, propagating or transferring programs to be used by or in combination with the instruction execution system, device or equipment. More specific examples of the computer-readable medium may include but be not limited to: an electronic connection (an electronic device) with one or more wires, a portable computer enclosure (a magnetic device), a random-access memory (RAM), a read-only memory (ROM), an erasable programmable read-only memory (EPROM or a flash memory), an optical fiber device and a portable compact disk read-only memory (CDROM). In addition, the computer-readable medium may even be a paper or other appropriate medium capable of printing programs thereon, this is because, for example, the paper or other appropriate medium may be optically scanned and then edited, decrypted or processed with other appropriate methods when necessary to obtain the programs in an electric manner, and then the programs may be stored in the computer memories.

It should be understood that, each part of the present disclosure may be realized by hardware, software, firmware or their combination. In the above embodiments, a plurality of steps or methods may be realized by the software or firmware stored in the memory and executed by the appropriate instruction execution system. For example, if it is realized by the hardware, likewise in another embodiment, the steps or methods may be realized by one or a combination of the following techniques known in the art: a discrete logic circuit having a logic gate circuit for realizing a logic function of a data signal, an application-specific integrated circuit having an appropriate combination logic gate circuit, a programmable gate array (PGA), a field programmable gate array (FPGA), and the like.

It should be noted that, in the description of the present specification, the description with reference to the terms "one embodiment", "some embodiments", "example", "specific example", or "some examples", and the like, means that a specific feature, structure, material, or characteristic described in connection with the embodiment or example is included in at least one embodiment or example of the present disclosure. Thus, the illustrative descriptions of the terms throughout this specification are not necessarily referring to the same embodiment or example of the present disclosure. Furthermore, the specific features, structures, materials, or characteristics may be combined in any suitable manner in one or more embodiments or examples. In addition, various embodiments or examples described in the specification and features of various embodiments or examples, may be incorporated and combined by those skilled in the art in case of an absence of confliction.

In the description of the present specification, the description with reference to the terms "one embodiment", "some embodiments", "example", "specific example", or "some examples", and the like, means that a specific feature, structure, material, or characteristic described in connection with the embodiment or example is included in at least one embodiment or example of the present disclosure. Thus, the illustrative descriptions of the terms throughout this specification are not necessarily referring to the same embodiment or example of the present disclosure. Furthermore, the specific features, structures, materials, or characteristics may be combined in any suitable manner in one or more embodiments or examples. In addition, various embodiments or examples described in the specification and features of various embodiments or examples, may be incorporated and combined by those skilled in the art in case of an absence of confliction.

Although explanatory embodiments of the present disclosure have been shown and described, it would be appreciated by those skilled in the art that the above embodiments are illustrative, and cannot be construed to limit the present disclosure. Changes, modifications, alternatives, and transformation can be made to the embodiments by those skilled in the art without departing from scope of the present disclosure.

What is claimed is:

1. A method of control-focusing for a dual-core focusing image sensor, the dual-core focusing image sensor comprising:
    a photosensitive cell array comprising:
        a plurality of focus photosensitive units, each of which comprising a first half and a second half; and
        a plurality of dual-core focusing photosensitive pixels;
    a filter cell array disposed above the photosensitive cell array and comprising a plurality of white filter cells; and
    a micro-lens array disposed above the filter cell array and comprising:
        a plurality of first micro-lenses, each of which having an elliptical shape; and
        a plurality of second micro-lenses;
    wherein the first half of each of the plurality of focus photosensitive units is covered by one of the white filter cells and the second half of each of the plurality of focus photosensitive units is covered by the plurality of the second micro-lenses, each of the white filter cells is covered by one of the first micro-lenses, and each of the dual-core focusing photosensitive pixels is covered by one of the second micro-lenses; and
    the method comprising:
        controlling the photosensitive cell array to enter a focusing mode;
        reading first phase difference information of each of the focusing photosensitive units and second phase difference information of each of the dual-core focusing photosensitive pixels; and
        performing a focusing processing according to the first phase difference information and the second phase difference information.

2. The method of claim 1, wherein the first half of each of the plurality of focus photosensitive units has a plurality of photosensitive pixels; and
    reading the first phase difference information of each of the focusing photosensitive units comprises:
        reading output values of a part of the photosensitive pixels in the first half of each of the plurality of focus photosensitive units as a set of first output values;
        reading output values of remaining of the photosensitive pixels in the first half of each of the plurality of focus photosensitive units as a set of second output values; and
        acquiring the first phase difference information according to the set of first output values and the set of second output values.

3. The method of claim 1, wherein each of the dual-core focusing photosensitive pixels has a first photodiode and a second photodiode; and
    reading the second phase difference information of each of the dual-core focusing photosensitive pixels comprises:
        reading an output value of the first photodiode as a third output value;
        reading an output value of the second photodiode as a fourth output value; and
        acquiring the second phase difference information according to the third output value and the fourth output value.

4. The method of claim 1, wherein the dual-core focusing photosensitive pixels are arranged in a Bayer pattern.

5. The method of claim 1, wherein the micro-lens array has a vertical centerline and a horizontal centerline, and the first micro-lenses comprise:
    a first group of first micro-lenses disposed along the horizontal centerline; and
    a second group of first micro-lenses disposed along the vertical centerline.

6. The method of claim 5, wherein the micro-lens array has four edges, and the first micro-lenses further comprise:
    a third group of first micro-lenses disposed along the four edges.

7. The method of claim 6, wherein each of the first group of first micro-lenses and the second group of first micro-lenses has a lens density greater than a lens density of the third group of first micro-lenses, respectively.

8. The method of claim 1, wherein each of the focusing photosensitive units comprises N*N photosensitive pixels and the photosensitive pixels in the first half are dual-core focusing photosensitive pixels, and the first half is an upper half, a lower half, a left half, or a right half of the each of the focusing photosensitive units;
    each of the dual-core focusing photosensitive pixels has a first photodiode and a second photodiode; and
    the method further comprises:
        controlling the photosensitive cell array to enter an imaging mode; and
        controlling the photosensitive cell array to be exposed, and reading a set of output values of the photosensitive cell array to obtain a set of pixel values of the photosensitive cell array to generate an image, wherein the pixel values of the first half are obtained by an interpolation algorithm, and the pixel value of each of the dual-core focusing photosensitive pixels is a sum of an output value of the first photodiode and an output value of the second photodiode.

9. A dual-core focusing image sensor, comprising:
    a photosensitive cell array comprising:
        a plurality of focus photosensitive units, each of which comprising a first half and a second half; and
        a plurality of dual-core focusing photosensitive pixels;
    a filter cell array disposed above the photosensitive cell array and comprising a plurality of white filter cells; and
    a micro-lens array disposed above the filter cell array and comprising:
        a plurality of first micro-lenses each of which has an elliptical shape; and
        a plurality of second micro-lenses;
    wherein the first half of each of the plurality of focus photosensitive units is covered by one of the white filter cells and the second half of each of the plurality of focus photosensitive units is covered by the plurality of the second micro-lenses, each of the white filter cells is covered by one of the first micro-lenses, and each of the dual-core focusing photosensitive pixels is covered by one of the second micro-lenses; and
    wherein first phase difference information of each of the focusing photosensitive units and second phase difference information of each of the dual-core focusing photosensitive pixels are configured for a focusing processing when the photosensitive cell array is in a focusing mode.

10. The dual-core focusing image sensor of claim 9, wherein the dual-core focusing photosensitive pixels are arranged in a Bayer pattern.

11. The dual-core focusing image sensor of claim 9, wherein the micro-lens array has a vertical centerline and a horizontal centerline, and the first micro-lenses comprise:
   a first group of first micro-lenses disposed along the horizontal centerline; and
   a second group of first micro-lenses disposed along the vertical centerline.

12. The dual-core focusing image sensor of claim 11, wherein the micro-lens array has four edges, the first micro-lenses further comprise:
   a third group of first micro-lenses disposed along the four edges.

13. The dual-core focusing image sensor of claim 12, wherein each of the first group of first micro-lenses and the second group of first micro-lenses has a lens density greater than a lens density of the third group of first micro-lenses, respectively.

14. The dual-core focusing image sensor of claim 9, wherein each of the focusing photosensitive unit comprises N*N photosensitive pixels and the photosensitive pixels in the first half are dual-core focusing photosensitive pixels, and the first half is an upper half, a lower half, a left half, or a right half of the each of the focusing photosensitive units.

15. A mobile terminal, comprising:
   an image sensor comprising:
      a photosensitive cell array comprising:
         a plurality of normal focusing photosensitive pixels; and
         a plurality of dual-core focusing photosensitive pixels;
      a filter cell array disposed above the photosensitive cell array and comprising:
         a plurality of white filter cells; and
      a micro-lens array disposed above the filter cell array and comprising:
         a plurality of first micro-lenses, each of which having an elliptical shape and covers one of the white filter cells; and
         a plurality of second micro-lenses, each of which covering one dual-core focusing photosensitive pixel; and
      wherein the normal focusing photosensitive pixels are covered by the white filter cells, each normal focusing photosensitive pixel corresponds to one dual-core focusing photosensitive pixel, and the normal photosensitive pixels covered by one of the white filter cells are arranged continuously;
   a non-transitory memory, storing executable program codes; and
   a processor, configured to perform a program corresponding to the executable program codes to:
      control the photosensitive cell array to enter a focusing mode;
      read first phase difference information of the normal photosensitive pixels covered by the one of the white filter cells and second phase difference information of each of the dual-core focusing photosensitive pixels; and
      perform a focusing processing according to the first phase difference information and the second phase difference information.

16. The mobile terminal of claim 15, wherein the dual-core focusing photosensitive pixels are arranged in a Bayer pattern.

17. The mobile terminal of claim 15, wherein the micro-lens array has a vertical centerline and a horizontal centerline, and the first micro-lenses comprise:
   a first group of first micro-lenses disposed along the horizontal centerline; and
   a second group of first micro-lenses disposed along the vertical centerline.

18. The mobile terminal of claim 17, wherein the micro-lens array has four edges, the first micro-lenses further comprise:
   a third group of first micro-lenses disposed along the four edges.

19. The mobile terminal of claim 18, wherein each of the first group of first micro-lenses and the second group of first micro-lenses has a lens density greater than a lens density of the third group of first micro-lenses, respectively.

20. The mobile terminal of claim 15, wherein a number of the normal focusing photosensitive pixels covered by one of the white filter cells is 2.

* * * * *